(12) United States Patent
Stecher

(10) Patent No.: US 7,781,828 B2
(45) Date of Patent: Aug. 24, 2010

(54) INTEGRATED SEMICONDUCTOR CHIP WITH LATERAL THERMAL INSULATION

(75) Inventor: Matthias Stecher, Munich (DE)

(73) Assignee: Infineon Technologies Austria AG, Villach (AT)

( * ) Notice: Subject to any disclaimer, the term of this patent is extended or adjusted under 35 U.S.C. 154(b) by 465 days.

(21) Appl. No.: 11/774,051

(22) Filed: Jul. 6, 2007

(65) Prior Publication Data
US 2008/0006913 A1 Jan. 10, 2008

(30) Foreign Application Priority Data
Jul. 7, 2006 (DE) .................. 10 2006 031 539

(51) Int. Cl.
*H01L 29/732* (2006.01)
(52) U.S. Cl. .................. 257/330; 257/329; 257/340; 257/341; 257/E29.257; 257/E21.417
(58) Field of Classification Search .............. 257/287, 257/329–332, 335, 341, 502, 512–520, 618–622, 257/E29.257, E21.417, E21.418, E21.609, 257/E21.61, E21.629, E21.643; 438/212, 438/259, 268, 270, 271, 589
See application file for complete search history.

(56) References Cited
U.S. PATENT DOCUMENTS
6,025,237 A * 2/2000 Choi ..................... 438/301

6,972,458 B2 * 12/2005 Suzuki et al. ............... 257/330
2005/0046014 A1 3/2005 Wong FOREIGN PATENT DOCUMENTS
DE 6950046 1/1997
EP 1033751 9/2000
WO 2004034462 4/2004

OTHER PUBLICATIONS
DE Office Action for German Patent Application No. 10 2006 031 539.1 mailed Jun. 25, 2008 (2 pages).

* cited by examiner

*Primary Examiner*—Jasmine J Clark
(74) *Attorney, Agent, or Firm*—Dicke, Billig & Czaja, PLLC (57) ABSTRACT

An integrated semiconductor with lateral thermal insulation is disclosed. In one embodiment, the chip has, on a common substrate, at least one power semiconductor circuit region and, laterally adjacent to the power semiconductor circuit region, at least one further temperature-sensitive semiconductor circuit region, interspaces being maintained between the circuit regions. At least one thermally insulating trench is provided at least in each interspace in each case between power semiconductor circuit region(s) and temperature-sensitive semiconductor circuit region(s), which at least one thermally insulating trench extends into the depth of the chip right into the substrate and in the longitudinal direction of the chip at least over a lateral side of the at least one power semiconductor circuit region and/or the temperature-sensitive semiconductor circuit region and is either unfilled or filled with a thermally insulating filling material.

25 Claims, 11 Drawing Sheets

INTEGRATED SEMICONDUCTOR CHIP WITH LATERAL THERMAL INSULATION

CROSS-REFERENCE TO RELATED APPLICATIONS

This Utility Patent Application claims priority to German Patent Application No. DE 10 2006 031 539.1 filed on Jul. 7, 2006, which is incorporated herein by reference.

BACKGROUND

One aspect of the invention relates to an integrated semiconductor chip having, on a common substrate, at least one power semiconductor circuit region and, laterally adjacent to the power semiconductor circuit region, at least one further temperature-sensitive semiconductor circuit region, interspaces being maintained between the circuit regions.

Such integrated semiconductor chips which are constructed e.g., using high-voltage CMOS or BCD technology contain e.g., a plurality of power output stages together with a logic circuit region and/or an analog circuit region and/or, if appropriate, a flash memory. The power output stages are generally positioned at the chip edge in order to keep the resistances of the bonding connections as small as possible. The flash memory, which is generally the most sensitive to temperature, must for the most part lie in direct proximity to the output stages. Owing to the high electrical powers switched in the output stages, a very large amount of heat is developed here and thermally loads adjacent components, that is to say components of the temperature-sensitive semiconductor circuits. These thermal loadings essentially arise during switching operations and are therefore temporally limited. In the case of repetitive clamping, the switching operations last for 50 to 500 µs. If these operations last longer, the thermal switching losses generated are not as high. Generally, the temperature-sensitive components lying e.g., in the flash memory alongside the power output stages must not be exposed to temperatures higher than 150° C. By virtue of the advancing miniaturization of the CMOS transistors, in particular the PMOS transistors therein become more sensitive to temperature. Their voltage-temperature characteristic (VT) starts to shift.

In previously developed, commercially available integrated semiconductor chips, primarily to heat dissipations heat sinks are a tried and tested means for enabling the temperature of the entire semiconductor chip not to rise excessively. This was possible since the high-voltage processes had not yet been miniaturized to an extent such that temperature problems arose. High-voltage CMOS or BCD processes in the range of less than 250 nm will be developed in the future, however. For this reason, lateral thermal insulation measures on the integrated semiconductor chip at least between in each case the temperature-sensitive semiconductor circuit regions and the power semiconductor circuit region(s) are desirable or necessary.

SUMMARY

One embodiment includes an integrated semiconductor with lateral thermal insulation. In one embodiment, the chip has, on a common substrate, at least one power semiconductor circuit region and, laterally adjacent to the power semiconductor circuit region, at least one further temperature-sensitive semiconductor circuit region, interspaces being maintained between the circuit regions. At least one thermally insulating trench is provided at least in each interspace in each case between power semiconductor circuit region(s) and temperature-sensitive semiconductor circuit region(s), which at least one thermally insulating trench extends into the depth of the chip right into the substrate and in the longitudinal direction of the chip at least over a lateral side of the at least one power semiconductor circuit region and/or the temperature-sensitive semiconductor circuit region and is either unfilled or filled with a thermally insulating filling material.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various embodiments described herein may be combined with each other, unless specifically noted otherwise.

One aspect of the invention specifies an integrated semiconductor chip of the generic type such that it enables an effective lateral thermal insulation between the power semiconductor circuit region(s) and the temperature-sensitive semiconductor circuit region(s).

In accordance with one embodiment, an integrated semiconductor chip is characterized by the fact that at least one thermally insulating trench is provided at least in each interspace in each case between power semiconductor circuit region(s) and temperature-sensitive semiconductor circuit region(s), which at least one thermally insulating trench extends into the depth of the chip right into the substrate and in the longitudinal direction of the chip at least over a lateral side of the at least one power semiconductor circuit region and/or the temperature-sensitive semiconductor circuit region and is either unfilled or filled with a thermally insulating filling material.

By using such thermally insulating trenches which are either filled with a material having high thermal resistance or which are alternatively empty, i.e. unfilled, the heat-generating chip regions can be thermally decoupled from the thermally sensitive chip regions. The depth of the thermally insulating trenches is at least approximately one third of the chip thickness. The thermally insulating trench or the thermally insulating trenches can reach as far as the silicon surface of the chip. However, they can also be buried below the silicon surface of the chip. In the latter case, however, there should be a very small distance between the upper edge of the thermally insulating trench and the silicon surface. The heat usually arises in the depth of 2 to 6 $\mu$m in such an integrated semiconductor chip.

In one embodiment, a plurality of thermally insulating trenches can be formed alongside one another in the interspace or interspaces between the power semiconductor circuit region(s) and the temperature-sensitive semiconductor circuit region(s) for the purpose of even better thermal insulation, the thermally insulating trenches being constructed identically and running approximately parallel alongside one another.

In the case of the thermally insulating trenches filled with a filling material, the filling material can be either electrically insulating or electrically conductive and, in the latter case, produce e.g., a substrate contact to the silicon surface of the chip. In the case of the electrically conductive filling material, the latter includes polysilicon and the sidewalls of the thermally insulating trench are then lined with an insulating oxide.

The conduction type of the polysilicon filling the thermally insulating trench or the thermally insulating trenches is identical to the conduction type of the substrate.

As a further measure, the semiconductor chip according to one embodiment additionally has an electrical insulation layer having good thermal conductivity on the chip rear side between the substrate and a rear side metallization, the electrical insulation layer including e.g., SiC or diamond. In this case, the depth of the thermally insulating trenches is chosen such that it reaches as far as the electrical insulation layer.

In the case where the power semiconductor circuit region(s) have a vertical power transistor, e.g., a vertical DMOS, the electrical insulation layer is cut out below the or each power semiconductor circuit region.

As an additional thermal insulation measure, a void can be provided between the substrate and an overlying silicon epitaxial layer, the void extending over the area of the respective temperature-sensitive semiconductor circuit region.

In one embodiment of the integrated semiconductor chip, the plurality of power semiconductor circuit regions are spatially combined to form at least one power block and the plurality of temperature-sensitive semiconductor circuit regions are spatially combined to form at least one second (temperature-sensitive) circuit block. In this case, at least one such thermally insulating trench in each case is situated in the interspace between each power block and each second (temperature-sensitive) circuit block.

The semiconductor chip according to one aspect can be present in a plurality of exemplary embodiments in which the power semiconductor circuit region(s) or the at least one power block can be equipped with bipolar high-voltage transistors in one example, with DMOS high-voltage transistors in an alternative example, and wherein the DMOS high-voltage transistors can be either vertical or lateral MOS transistors.

In further embodiments of the semiconductor chip according to aspects of the invention, the temperature-sensitive semiconductor circuit region(s) or the second temperature-sensitive circuit block are equipped with a low-voltage semiconductor circuit, which may have a logic circuit and/or an analog circuit and/or a memory circuit.

In the case of an integrated semiconductor chip realized with the above features, the lateral thermal diffusion can be greatly restricted by the thermally insulating trenches that are unfilled or filled with oxide, oxide/polysilicon. By way of example, 1 $\mu$m of oxide has a thermal resistance corresponding to 300 $\mu$m of silicon. Since, on account of the thermally insulating trenches whose depth is at least approximately one third of the wafer thickness, the heat cannot propagate toward the side, it propagates toward the rear side of the chip. On the chip rear side it is possible to provide effective heat dissipating layers that dissipate the heat e.g., toward a heat sink. High but short heat pulses such as arise in power transistors (including NPN, vertical, lateral DMOS, etc.) can be kept away from the temperature-sensitive semiconductor circuit regions on the semiconductor chip by using the thermally insulating trenches according to embodiments of the invention.

Figure 1A:
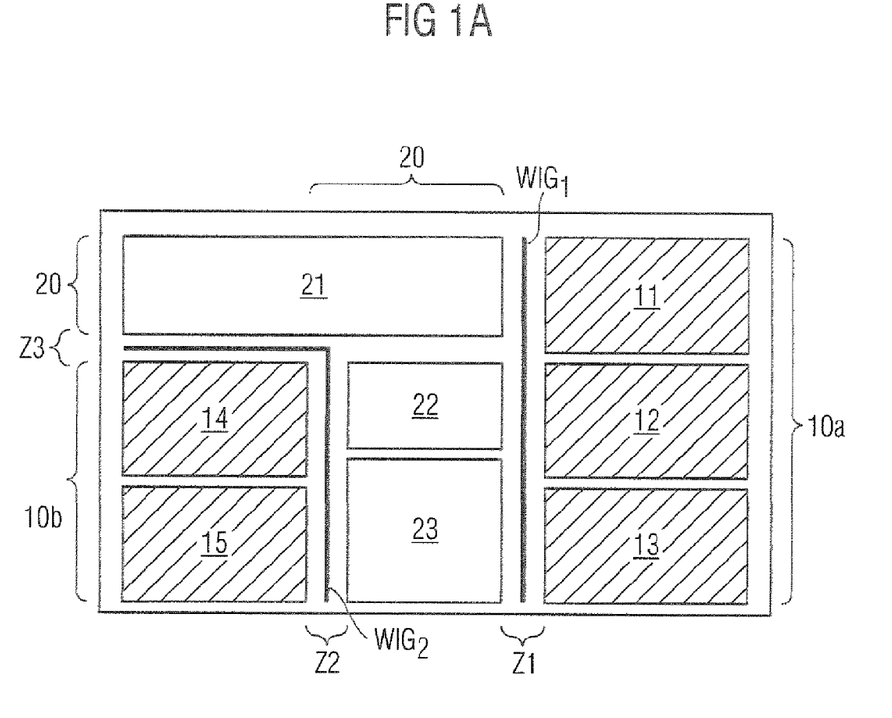
FIGS. 1A, 1B and 1C illustrate schematic layout views of three different exemplary embodiments of an integrated semiconductor chip.
Figure 1B:
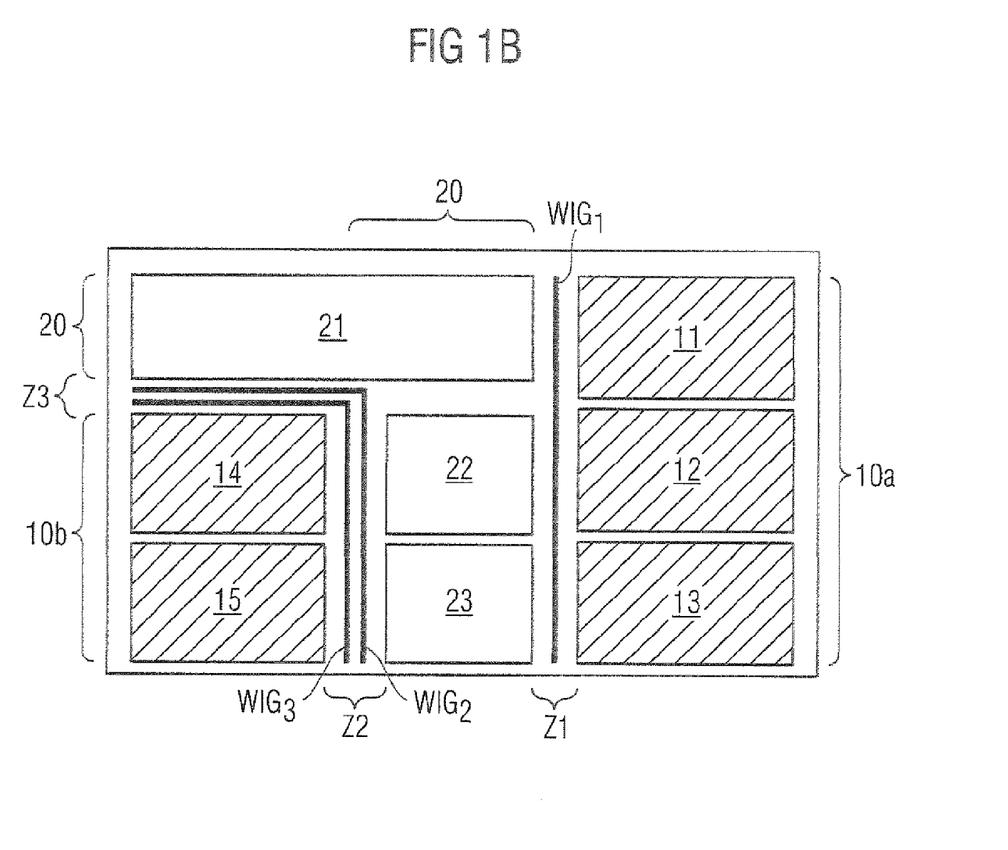
Figure 1C:
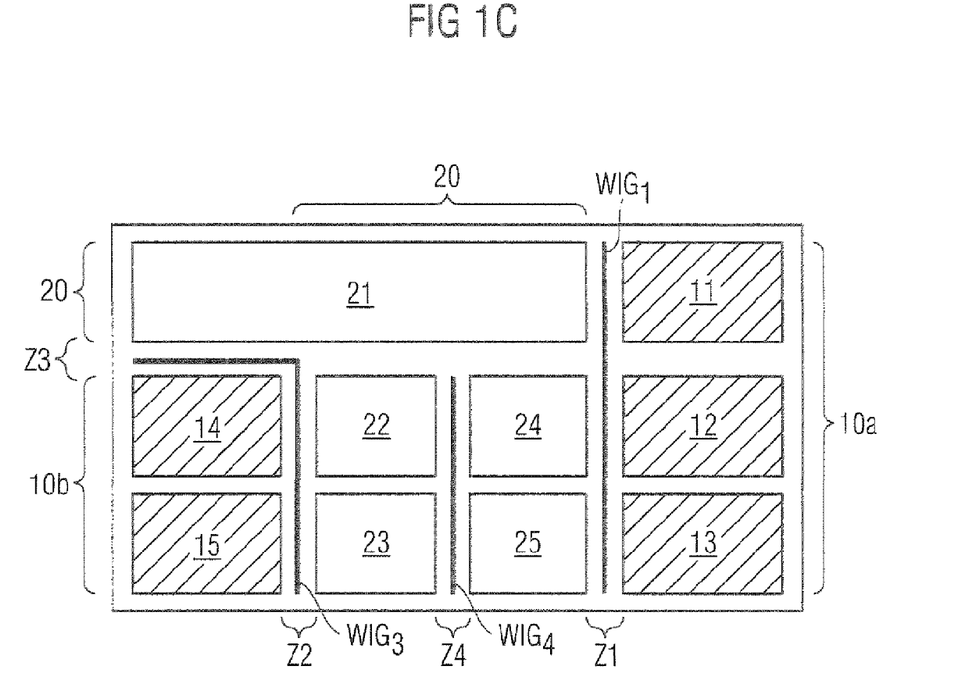

The layout views—illustrated schematically in FIGS. 1A, 1B and 1C—of integrated semiconductor chips configured according to embodiments of the invention illustrate customary partitionings with a plurality of power semiconductor circuit regions 11-15 positioned at the chip edge in order to keep the resistances of the bonding connections as small as possible, and additionally with a plurality of temperature-sensitive semiconductor circuit regions 21, 22, 23 (FIGS. 1A and 1B) and 21-25 (FIG. 1C). By way of example, the temperature-sensitive semiconductor circuit region 21 is a logic circuit region, the circuit region 22 contains e.g., analog circuits, and the circuit region 23 has e.g., a flash memory. The circuit regions 24 and 25 in accordance with FIG. 1C may represent e.g., logic and/or analog and/or flash memory areas. The flash memory (e.g., the circuit region 23) is usually the most sensitive to temperature and lies in direct proximity to the power semiconductor circuit regions 12, 13, 14, 15. As can be seen from FIGS. 1A-1C, the plurality of semiconductor circuit regions are combined to form circuit blocks (in this case to form two circuit blocks 10A and 10B), while the temperature-sensitive semiconductor circuit regions likewise form a circuit block 20. In the case of the exemplary embodiments illustrated in FIGS. 1A-1C, a first thermally insulating trench WIG1 lies in an interspace Z1 between the power block 10A and the temperature-sensitive circuit block 20. A second thermally insulating trench WIG2 extends in interspaces Z2 and Z3 between the second power block 10B with the power semiconductor circuit regions 14 and 15 and the temperature-sensitive circuit block 20, the second thermally insulating trench being embodied doubly in accordance with FIG. 1B, that is to say that two parallel thermally insulating trenches WIG2 and WIG3 of identical type are formed in the interspaces Z2 and Z3.

In the schematic layout illustration illustrated in FIG. 1C, a thermally insulating trench WIG4 is additionally formed in an interspace Z4 between temperature-sensitive semiconductor circuit regions 22, 23, on the one hand, and 24, 25, on the other hand. Consequently, the thermally insulating trenches WIG1-WIG3 provided according to an embodiment of the invention extend in the lateral direction in the respective interspaces Z1, Z2, Z3 at least over a longitudinal side of a power semiconductor circuit region or a power block 10A, 10B and/or over a longitudinal side of the temperature-sensitive semiconductor region, e.g., 21, or a longitudinal side of the temperature-sensitive circuit block 20. As is explained even more clearly below with reference to the cross-sectional illustrations, the depth of the thermally insulating trenches reaches right into the substrate and is at least approximately one third of the chip thickness. Moreover, the thermally insulating trenches WIG1-WIGn can either be unfilled or be filled with thermally insulating filling material, e.g., with an oxide lining and with polysilicon.

Figure 2A:
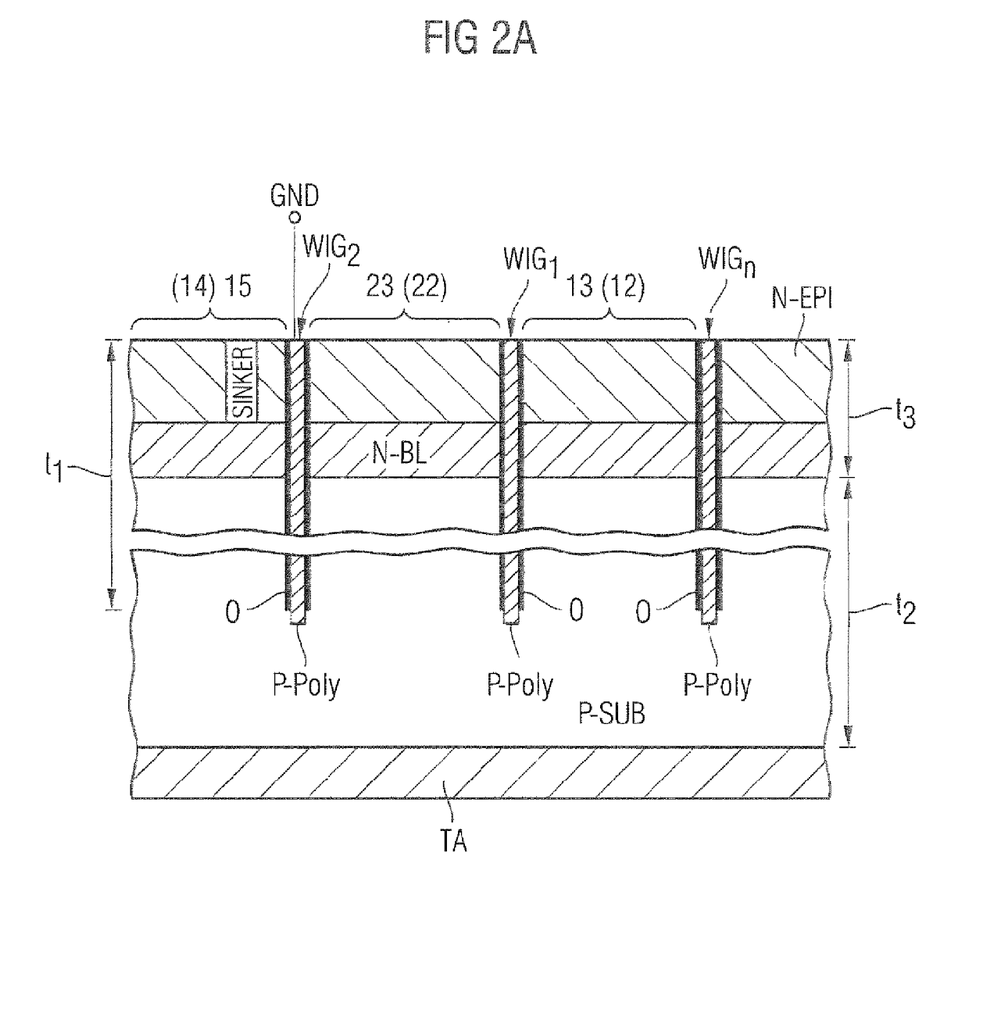
FIGS. 2A and 2B in each case illustrate a schematic cross section of the exemplary embodiment in accordance with FIGS. 1A and 1B, showing the arrangement according to the invention of the thermally insulating trenches in the depth direction of the semiconductor chip.

The integrated semiconductor chip illustrated in cross section in FIG. 2A represents a section e.g., through the regions 15, 23 and 13 in accordance with FIG. 1A. The illustration reveals thermally insulating trenches WIG1, WIG2, WIGn reaching right into the substrate P-SUB, in the case of which trenches only the walls are lined with insulating oxide O and which trenches are filled with P-type polysilicon P-POLY and thus produce a conductive connection of the substrate P-SUB to the silicon surface, that is to say to the surface of an N-type epitaxial layer N-EPI. The depth—designated by t1—of the thermally insulating trenches WIG1, WIG2, WIGn is at least one third of the chip thickness, which, in the example, is composed of the thickness t2 of the P-type substrate P-SUB and the thickness t3, where the thickness t3 is the sum of the thicknesses of the epitaxial layer N-EPI and a buried layer N-BL (t1>⅓ (t2+t3)). A thermal coupling TA to a heat sink (not illustrated) is situated on the rear side of the chip.

Figure 2B:
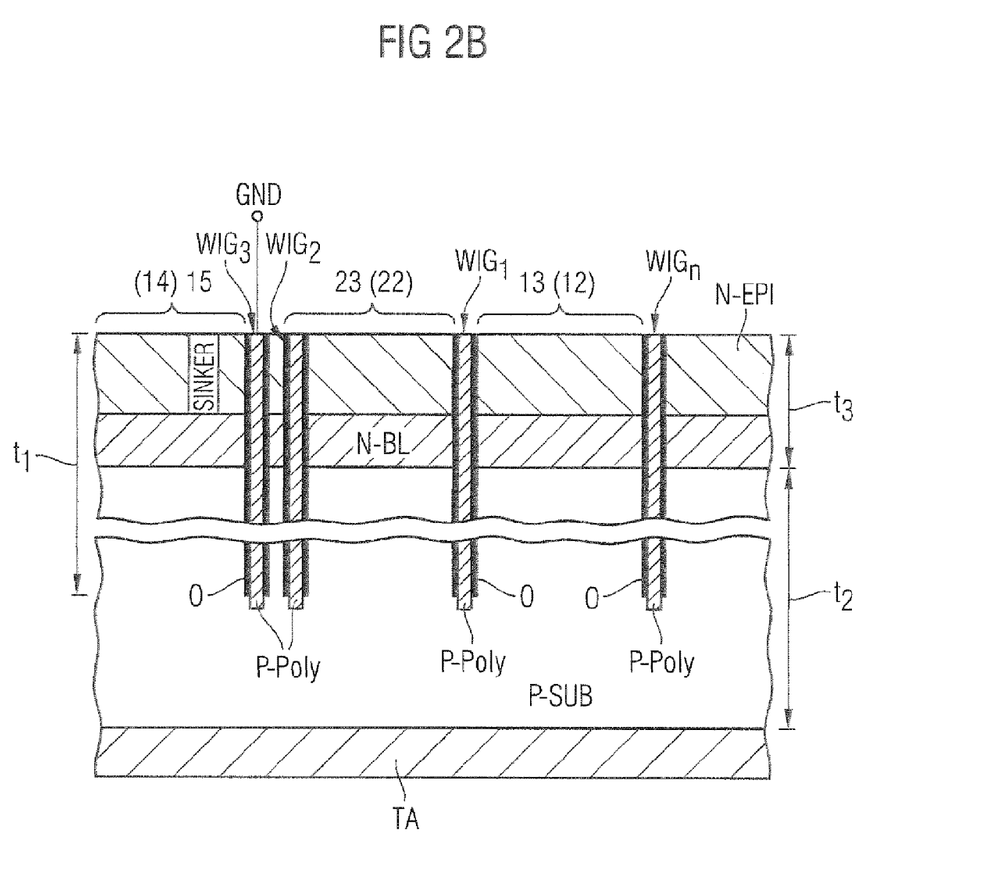

The cross-sectional illustration illustrated in FIG. 2B represents a section e.g., through the power semiconductor circuit regions 13, 15 and the temperature-sensitive semiconductor circuit region 23 and differs from the exemplary embodiment illustrated in the cross-sectional illustration of FIG. 2A by virtue of the fact that the thermally insulating trench in the interspace Z2 between the power semiconductor circuit region 15 and the temperature-sensitive semiconductor circuit region 23 is embodied doubly, that is to say includes two thermally insulating trenches WIG2 and WIG3 of identical type that lie parallel alongside one another (cf. FIG. 1B). The other regions and measures of the exemplary embodiment illustrated in FIG. 2B are identical to the corresponding features in FIG. 2A and designated by the same reference symbols. The parallel arrangement of a plurality, i.e. two in this example, of parallel thermally insulating trenches improves the thermal insulation between the power semiconductor circuit region 15 and the temperature-sensitive semiconductor circuit region 23, i.e. for example a flash memory, in comparison with the exemplary embodiment illustrated in FIG. 2A. In addition, what is common to the two exemplary embodiments illustrated in FIGS. 2A and 2B is that the thermally insulating trenches WIG1, WIG2, WIGn enable a substrate contact GND on the silicon surface by virtue of their polysilicon filling that produces a connection to the P-type substrate P-SUB.

Figure 3A:
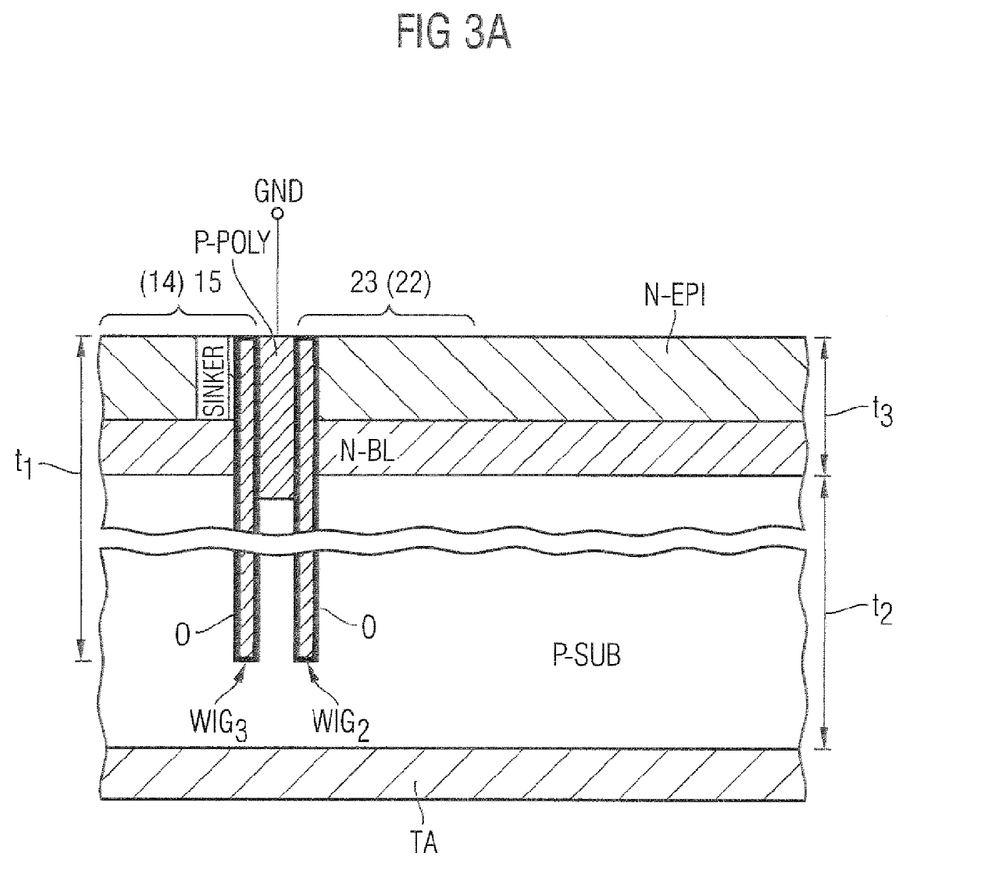
FIGS. 3A and 3B illustrate schematic cross-sectional views of an integrated semiconductor chip in which the thermally insulating trenches are completely insulated.
Figure 3B:
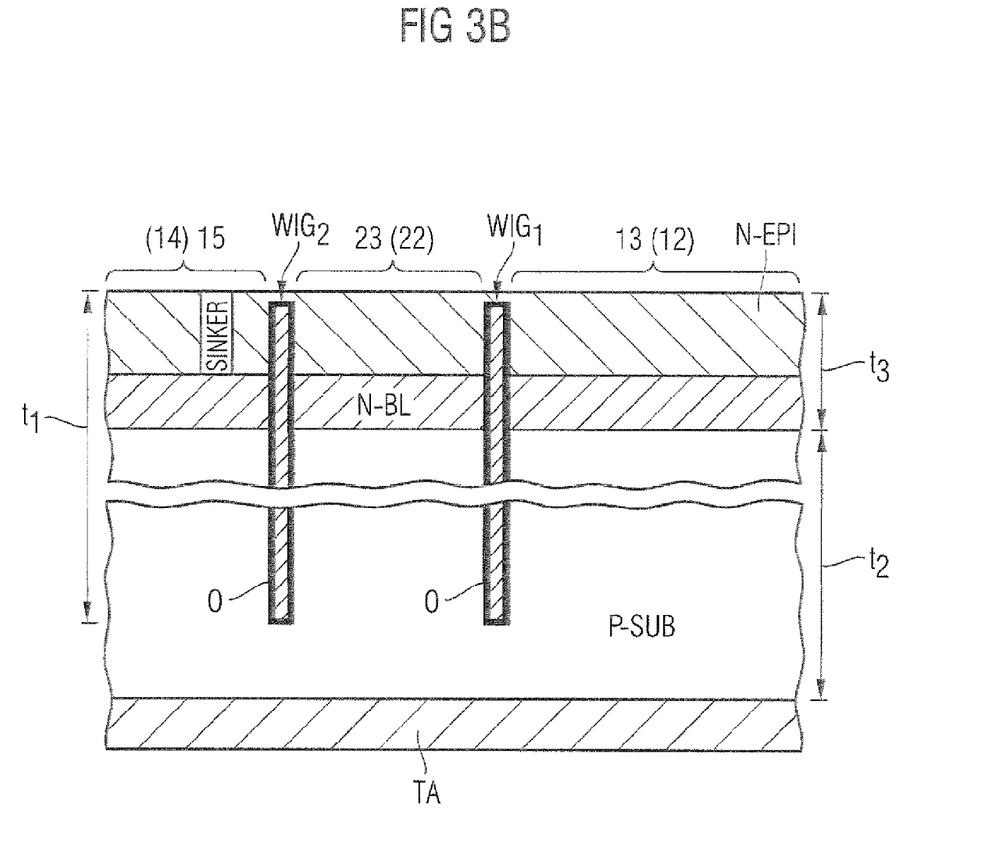

FIGS. 3A and 3B illustrate further exemplary embodiments of integrated semiconductor chips in which the thermally insulating trenches WIG2, WIG3 (FIG. 3A) and WIG1, WIG2 (FIG. 3B) are completely insulated. FIG. 3A illustrates that the substrate connection GND including polysilicon P-POLY is situated between the two parallel thermally insulating trenches WIG2 and WIG3. Otherwise, the construction of the integrated semiconductor chip is similar to that illustrated in FIG. 2B. While the thermally insulating trenches WIG2, WIG3 in accordance with FIG. 3A reach as far as the silicon surface, that is to say as far as the surface of the epitaxial layer N-EPI, the thermally insulating trenches WIG1 and WIG2 in accordance with FIG. 3B are completely buried. In this case, the remaining region of the silicon, that is to say of the epitaxial layer N-EPI between the upper edge of the thermally insulating trenches WIG1, WIG2 and the surface of the epitaxial layer N-EPI should be as small as possible. 0 µm would be best. The filling of the thermally insulating trenches WIG1, WIG2, WIG3 lined completely with oxide can be polysilicon in the case of the exemplary embodiments illustrated in FIGS. 3A, 3B. This need not necessarily be the case, however, since the filling material can also be a different thermally insulating material, e.g., oxide, which need not have electrical conductivity. There is also the possibility of leaving the thermally insulating trenches lined with oxide O in accordance with FIGS. 3A and 3B unfilled, that is to say empty, since an air filling also forms a good thermal insulator. By way of example, 1 µm of oxide has a thermal resistance corresponding to 300 µm of silicon.

Figure 4A:
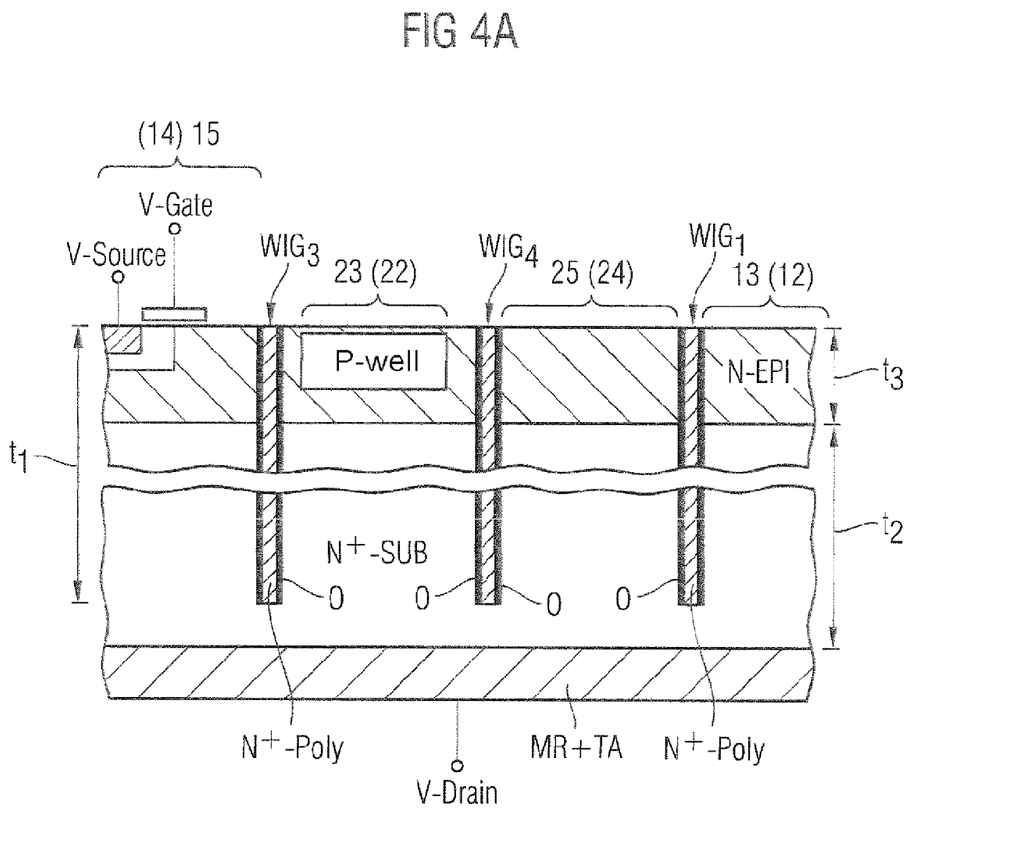
FIG. 4A illustrates a schematic cross section through an integrated semiconductor chip with common-drain technology with a vertical power DMOS transistor.

FIG. 4A illustrates a cross section e.g., through the semiconductor circuit regions 15, 23, 25 and 13 in accordance with FIG. 1C, the semiconductor circuit regions 13 and 15 of which are power semiconductor circuit regions in the example. The power semiconductor circuit region 15 has a vertical power DMOS transistor, the gate of which is connected to a gate voltage V-GATE, the source of which is connected to a source voltage V-SOURCE and the drain of which, formed by the rear side metallization MR+TA, is connected to a drain voltage V-DRAIN. Consequently, FIG. 4A illustrates an integrated semiconductor chip in common-drain technology, the substrate of which is an N$^+$-type substrate and the epitaxial layer of which is an N-type epitaxial layer. Situated in a P-type well in the temperature-sensitive semiconductor circuit region 23 are for example CMOS or bipolar circuit parts (not illustrated) in a P-type well. Here, too, the depth of the thermally insulating trenches WIG1, WIG3, WIG4 lined with oxide O is at least one third of the chip thickness composed of t2+t3. The rear side metallization MR+TA simultaneously also forms a heat-dissipating connection to a heat sink (not illustrated).

Figure 4B:
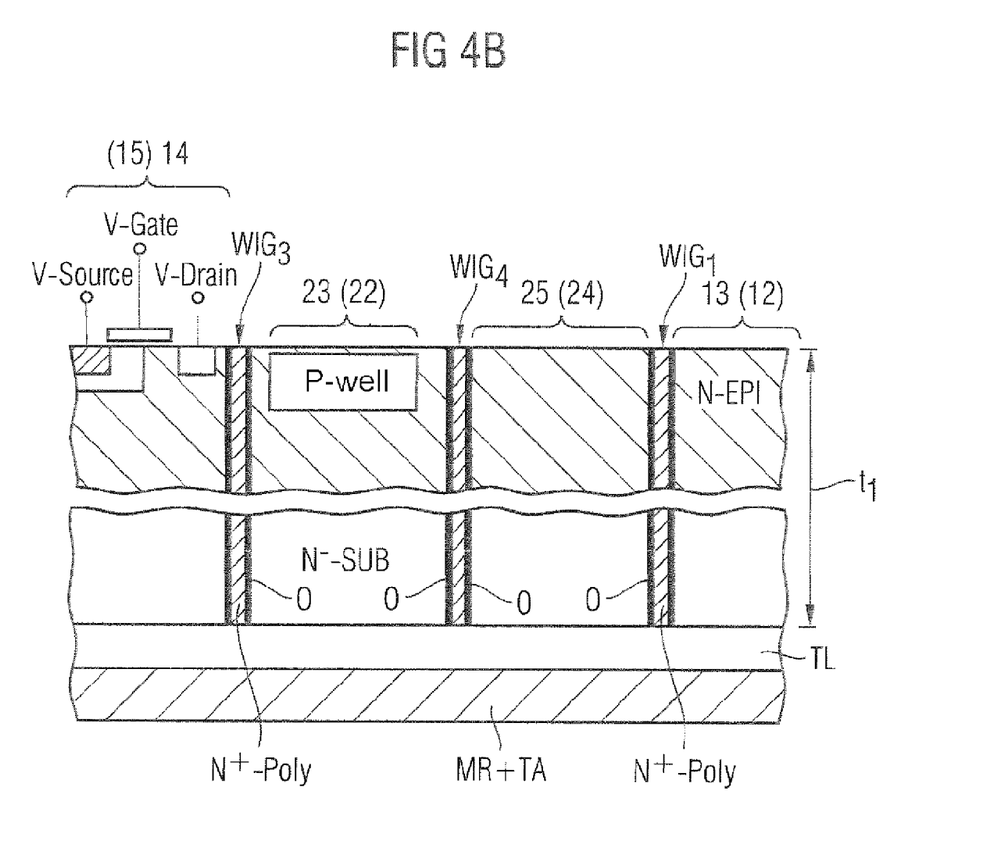
FIG. 4B illustrates a schematic cross section through an integrated semiconductor chip which has, in addition to the thermally insulating trenches, a material having good thermal conductivity on the chip rear side and a lateral power DMOS transistor.

FIG. 4B illustrates a cross-sectional view of yet a different exemplary embodiment. In the exemplary embodiment illustrated in FIG. 4B, the power transistor technology in the power semiconductor circuit region 15 is a lateral power DMOS technology, wherein source voltage V-SOURCE is applied to a source electrode of the lateral power DMOS, gate voltage V-GATE is applied to a gate electrode of the lateral power DMOS and drain voltage V-DRAIN is applied to a drain electrode of the lateral power DMOS. As illustrated, the thermally insulating trenches WIG1, WIG3 and WIG4 are lined with oxide and filled with n⁺-type polysilicon in FIG. 4B, too. In contrast to the exemplary embodiment illustrated in FIG. 4A, the exemplary embodiment of FIG. 4B has a layer TL that has good thermal conductivity but is not electrically conductive on the rear side of the chip, which layer can be used to produce completely electrically insulating circuit blocks. SiC, for example, is appropriate as the material of the layer TL. However, the material can also be diamond. If possible, the semiconductor wafer should be as thin as possible in order to save etching costs when etching the thermally insulating trenches. The substrate is an N⁻-type substrate N⁻-SUB in the exemplary embodiment illustrated in FIG. 4B.

Figure 4C:
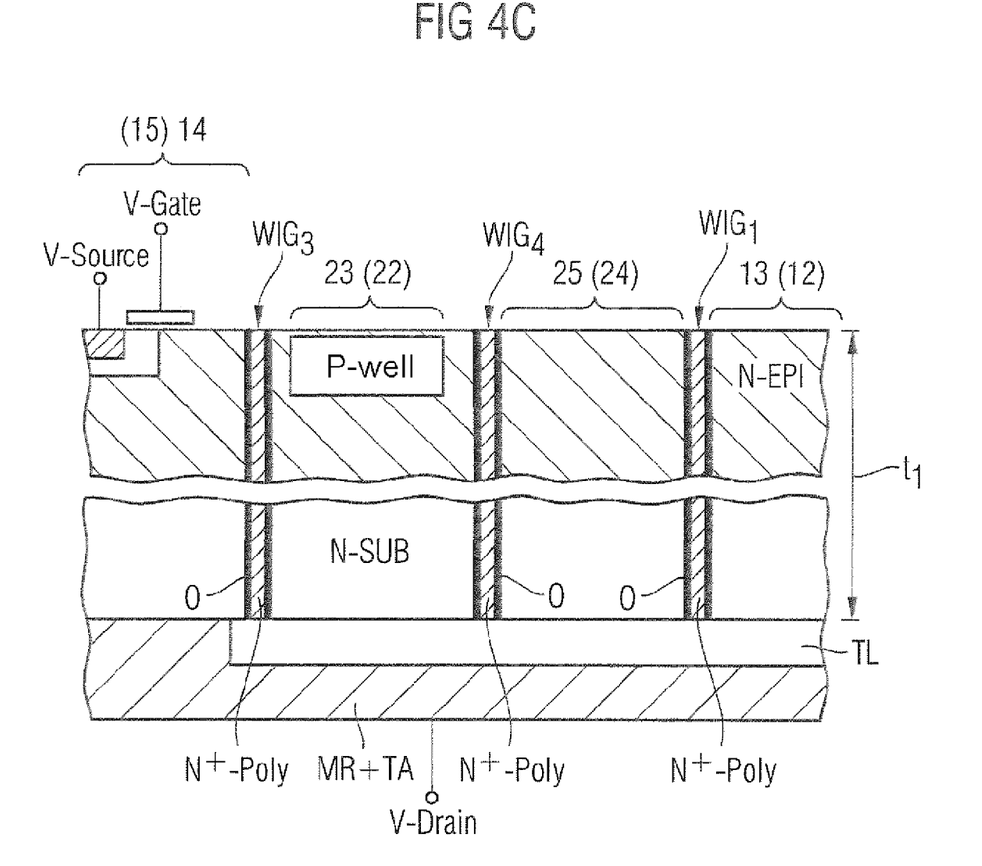
FIG. 4C illustrates a schematic cross section of an integrated semiconductor chip which represents a combination of the exemplary embodiments in accordance with FIGS. 4A and 4B, to be precise a vertical power DMOS transistor in a power semiconductor circuit region, and in which the layer having good thermal conductivity is cut out between the rear side metallization and the substrate in the region of the vertical power DMOS transistor.

The exemplary embodiment illustrated in FIG. 4C forms a combination of the exemplary embodiments illustrated in FIGS. 4A and 4B. As in the exemplary embodiment illustrated in FIG. 4A, the power transistor in the power semiconductor circuit region 15 is a vertical power DMOS transistor. The layer TL on the rear side of the chip, which layer includes SiC or some other material that has good thermal conductivity but is not electrically conductive, is cut out below the power semiconductor circuit region 15, that is to say below the vertical power DMOS transistor, in order to ensure the drain connection V-Drain thereof on the rear side by using the rear side metallization MR+TA. The other features of the exemplary embodiment illustrated in FIG. 4C correspond to the exemplary embodiments of FIGS. 4A and 4B that have already been outlined above.

It should be noted that the above-described exemplary embodiments illustrated in the sectional views of FIGS. 4A, 4B and 4C represent a section through the power semiconductor circuit regions 12 or 13 and 14 or 15 and the intervening temperature-sensitive semiconductor circuit regions 22 or 23 and 24 or 25, wherein, in addition to the thermally insulating trenches WIG1 and WIG3 in each case between the power blocks 10A and 10B and the intervening temperature-sensitive semiconductor circuit block 20, a thermally insulating trench WIG4 is also formed between temperature-sensitive semiconductor circuit regions 23 and 25, and 22 and 24.

Figure 5:
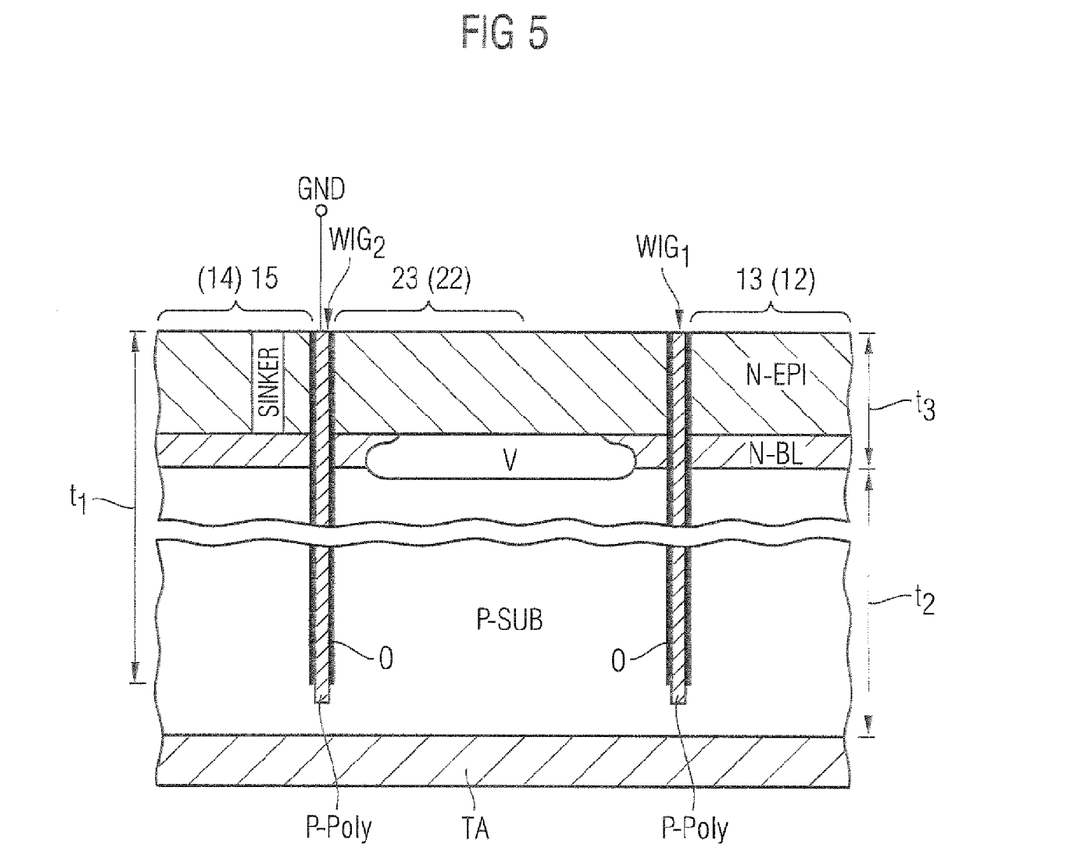
FIG. 5 illustrates a schematic cross section through an integrated semiconductor chip according to the invention with an additional void between substrate and epitaxial layer, the void extending over the area of the temperature-sensitive semiconductor region.

FIG. 5 illustrates, in a schematic cross section through the power semiconductor circuit regions 15 (14) and 13 (12) and also an intervening temperature-sensitive semiconductor circuit region 23 (22), a further measure that improves the thermal insulation still further by using an areal void V in the silicon below the temperature-sensitive semiconductor circuit region 23 (22). Otherwise, the exemplary embodiment illustrated in FIG. 5 largely corresponds to the exemplary embodiment in accordance with FIG. 2A, in which a substrate contact GND is produced by the P-type polysilicon filling P-POLY of the thermally insulating trenches WIG1, WIG2 lined with oxide O. The void V could be produced e.g., by using a trench etch prior to the growth of the epitaxial layer N-EPI. If the trenches etched as a result lie very close together, they are not filled during the subsequent epitaxial growth. If heat treatment is effected after the epitaxial growth with hydrogen, then the etched trenches combine to form the void V.

What is characteristic of all the exemplary embodiments of an integrated semiconductor chip according to the invention as described above with reference to FIGS. 1A, 1B, 1C, 2A, 2B, 3A, 3B, 4A, 4B, 4C and 5 is that at least one thermally insulating trench WIG1, WIG3 is provided at least in each interspace in each case between power semiconductor circuit region(s) and temperature-sensitive semiconductor circuit region(s), which at least one thermally insulating trench extends into the depth of the chip right into the substrate SUB and in the longitudinal direction of the chip at least over a lateral side of the at least one power semiconductor circuit region 11-15 and/or the temperature-sensitive semiconductor circuit region 21-23 and is either unfilled or filled with a thermally insulating filling material.

The depth t1 of the thermally insulating trench or of the thermally insulating trenches WIG1-WIG4 is at least approximately one third of the chip thickness.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated semiconductor chip having a substrate, the semiconductor chip comprising:
    at least one power semiconductor circuit region on the substrate;
    at least one further temperature-sensitive semiconductor circuit region on the substrate laterally adjacent to the power semiconductor circuit region;
    wherein interspaces are maintained between the circuit regions; and
    at least one thermally insulating trench provided in each interspace between the power semiconductor circuit region and the temperature-sensitive semiconductor circuit region;
    wherein the at least one thermally insulating trench extends into the depth of the semiconductor chip and into the substrate in the longitudinal direction of the chip at least over a lateral side of the at least one power semiconductor circuit region and/or the temperature-sensitive semiconductor circuit region and is either unfilled or filled with a thermally insulating filling material, and only the sidewalls of the thermally insulating trench are lined with insulating oxide.

2. The semiconductor chip of claim 1, wherein at least one thermally insulating trench is additionally provided in one interspace or a plurality of interspaces between temperature-sensitive semiconductor regions.

3. The semiconductor chip of claim 1, wherein the depth of the at least one thermally insulating trench is at least approximately one third of the chip thickness.

4. The semiconductor chip of claim 1, wherein the at least one thermally insulating trench reaches as far as the silicon surface of the chip.

5. The semiconductor chip of claim 1, wherein the at least one thermally insulating trench is buried below the silicon surface of the chip.

6. The semiconductor chip of claim 1, wherein a plurality of thermally insulating trenches of identical type are formed alongside one another in the interspace.

7. The semiconductor chip of claim 6, wherein the plurality of thermally insulating trenches run approximately parallel alongside one another.

8. The semiconductor chip of claim 1, wherein the filling material is also electrically insulating.

9. The semiconductor chip of claim 1, wherein the filling material is electrically conductive and is connected to the substrate in the depth of the thermally insulating trench, and the at least one thermally insulating trench is lined with insulating oxide.

10. The semiconductor chip of claim 9, wherein the filling material forms a substrate contact to the silicon surface of the chip.

11. The semiconductor chip of claim 9, wherein the filling material is polysilicon.

12. The semiconductor chip of claim 11, wherein the conduction type of the polysilicon is identical to the conduction type of the substrate.

13. An integrated semiconductor chip having a substrate, the semiconductor chip comprising:
- at least one power semiconductor circuit region on the substrate;
- at least one further temperature-sensitive semiconductor circuit region on the substrate laterally adjacent to the power semiconductor circuit region;
- wherein interspaces are maintained between the circuit regions; and
- at least one thermally insulating trench provided in each interspace between the power semiconductor circuit region and the temperature-sensitive semiconductor circuit region;
- wherein the at least one thermally insulating trench extends into the depth of the semiconductor chip and into the substrate in the longitudinal direction of the chip at least over a lateral side of the at least one power semiconductor circuit region and/or the temperature-sensitive semiconductor circuit region and is either unfilled or filled with a thermally insulating filling material,
- an electrical insulation layer having good thermal conductivity is additionally provided on the chip rear side between the substrate and a rear side metallization, and the at least one thermally insulating trench reaches as far as the electrical insulation layer.

14. The semiconductor chip of claim 13, wherein the electrical insulation layer is cut out below the at least one power semiconductor circuit region.

15. An integrated semiconductor chip having a substrate, the semiconductor chip comprising:
- at least one power semiconductor circuit region on the substrate;
- at least one further temperature-sensitive semiconductor circuit region on the substrate laterally adjacent to the power semiconductor circuit region;
- wherein interspaces are maintained between the circuit regions; and
- at least one thermally insulating trench provided in each interspace between the power semiconductor circuit region and the temperature-sensitive semiconductor circuit region;
- wherein the at least one thermally insulating trench extends into the depth of the semiconductor chip and into the substrate in the longitudinal direction of the chip at least over a lateral side of the at least one power semiconductor circuit region and/or the temperature-sensitive semiconductor circuit region and is either unfilled or filled with a thermally insulating filling material,
- a void is additionally provided between the substrate and an overlying silicon epitaxial layer, the void extending in the lateral direction over the area of the at least one temperature-sensitive semiconductor circuit region.

16. The semiconductor chip of claim 1, wherein on the chip a plurality of power semiconductor circuit regions are spatially combined to form at least one power block and a plurality of temperature-sensitive semiconductor circuit regions are spatially combined to form at least one second circuit block, and at least one thermally insulating trench in each case lies in the interspace and the interspaces between each power block and each second circuit block.

17. The semiconductor chip of claim 16, wherein the at least one power semiconductor circuit region or the power block has at least one power transistor.

18. The semiconductor chip of claim 17, wherein the power transistor is a bipolar high-voltage transistor.

19. The semiconductor chip of claim 17, wherein the power transistor is a DMOS high-voltage transistor.

20. The semiconductor chip of claim 19, wherein the DMOS high-voltage transistor is a vertical transistor.

21. The semiconductor chip of claim 19, wherein the DMOS high-voltage transistor is a lateral transistor.

22. The semiconductor chip of claim 1, wherein the at least one temperature-sensitive semiconductor circuit region or the second circuit block has a low-voltage semiconductor circuit.

23. The semiconductor chip of claim 22, wherein the low-voltage semiconductor circuit has a logic circuit.

24. The semiconductor chip of claim 22, wherein the low-voltage semiconductor circuit has an analog circuit.

25. The semiconductor chip of claim 22, wherein the low-voltage semiconductor circuit has a memory circuit.

* * * * *